United States Patent
Fattinger et al.

(10) Patent No.: US 12,052,010 B2
(45) Date of Patent: Jul. 30, 2024

(54) TEMPERATURE COMPENSATED BULK ACOUSTIC WAVE DEVICE BY NEUTRAL STRESS PLANE ENGINEERING THROUGH DOUBLE SIDED SILICON SUBSTRATE INTEGRATION

(71) Applicant: Qorvo US, Inc., Greensboro, NC (US)

(72) Inventors: Gernot Fattinger, Sorrento, FL (US); Michael Fattinger, Sorrento, FL (US); Paul Stokes, Orlando, FL (US)

(73) Assignee: Qorvo US, Inc., Greensboro, NC (US)

( * ) Notice: Subject to any disclaimer, the term of this patent is extended or adjusted under 35 U.S.C. 154(b) by 483 days.

(21) Appl. No.: 17/371,836

(22) Filed: Jul. 9, 2021

(65) Prior Publication Data
US 2022/0014166 A1  Jan. 13, 2022

Related U.S. Application Data

(60) Provisional application No. 63/049,770, filed on Jul. 9, 2020.

(51) Int. Cl.
*H03H 9/02* (2006.01)
*H03H 9/13* (2006.01)

(52) U.S. Cl.
CPC .... *H03H 9/02102* (2013.01); *H03H 9/02015* (2013.01); *H03H 9/0211* (2013.01); *H03H 9/02157* (2013.01); *H03H 9/131* (2013.01)

(58) Field of Classification Search
CPC .......... H03H 9/02102; H03H 9/02015; H03H 9/0211; H03H 9/02157; H03H 9/131; H03H 9/02133; H03H 9/175
USPC ................................. 333/187, 188
See application file for complete search history.

(56) References Cited

U.S. PATENT DOCUMENTS

2007/0285191 A1* 12/2007 Jacobsen ............... H03H 9/175 333/187
2015/0295556 A1* 10/2015 Jacobsen ............... H03H 9/175 29/25.35
2021/0167752 A1* 6/2021 Caron ..................... H03H 9/58

* cited by examiner

*Primary Examiner* — Rakesh B Patel
*Assistant Examiner* — Jorge L Salazar, Jr.
(74) *Attorney, Agent, or Firm* — Withrow & Terranova, P.L.L.C.

(57) ABSTRACT

The present disclosure relates to a Bulk Acoustic Wave (BAW) device with a substantially symmetrical structure in a vertical direction. The disclosed BAW device includes a main device region having a top electrode, a bottom electrode, and a piezoelectric layer sandwiched between the top electrode and the bottom electrode, a bottom reflector section underneath the bottom electrode, a bottom substrate underneath the bottom reflector section, a top reflector section over the top electrode, and a top substrate over the bottom reflector section. Herein, the bottom reflector section, the bottom substrate, the top reflector section, and the top substrate are configured so that a neutral plane of the BAW device is positioned at a center of the piezoelectric layer.

20 Claims, 4 Drawing Sheets

TEMPERATURE COMPENSATED BULK ACOUSTIC WAVE DEVICE BY NEUTRAL STRESS PLANE ENGINEERING THROUGH DOUBLE SIDED SILICON SUBSTRATE INTEGRATION

RELATED APPLICATIONS

This application claims the benefit of provisional patent application Ser. No. 63/049,770, filed Jul. 9, 2020, the disclosure of which is hereby incorporated herein by reference in its entirety.

FIELD OF THE DISCLOSURE

The present disclosure relates to a Bulk Acoustic Wave (BAW) device, and more particularly to a temperature compensated BAW device, which has a reflector section and a substrate on both top and bottom sides.

BACKGROUND

Due to high Q values, and low insertion losses at microwave frequencies, particularly those above 1.5 Gigahertz (GHz), Bulk Acoustic Wave (BAW) devices have been widely used in Radio Frequency (RF) applications. For instance, BAW filters are the filter of choice for many $3^{rd}$ Generation (3G) and 4th Generation (4G) wireless devices and are destined to dominate filter applications for 5th Generation (5G) wireless devices. The low insertion loss of the BAW filter provides many advantages such as improved battery life, compensation for higher losses associated with the need to support many frequency bands in a single mobile device, etc.

However, when the BAW device is packaged with carrier board (like a printed circuit board) that has a different coefficient of thermal expansion (CTE) from a substrate of the BAW device, the BAW device may experience an undesired frequency shift due to flexing of the BAW device caused by extra thermal stress. Accordingly, there remains a need for improved BAW device designs to minimize frequency shift due to the thermal stress. Further, there is also a need to maintain superior performance of the BAW device in linearity behavior, power consumption, and insertion losses.

SUMMARY

The present disclosure relates to a Bulk Acoustic Wave (BAW) device with a substantially symmetrical structure in vertical direction. The disclosed BAW device includes a main device region having a top electrode, a bottom electrode, and a piezoelectric layer sandwiched between the top electrode and the bottom electrode, a bottom reflector section underneath the bottom electrode, a bottom substrate underneath the bottom reflector section, a top reflector section over the top electrode, and a top substrate over the bottom reflector section. Herein, the bottom reflector section, the bottom substrate, the top reflector section, and the top substrate are configured so that a neutral plane of the BAW device is located within the main device region.

In one embodiment of the BAW device, the bottom reflector section, the bottom substrate, the top reflector section, and the top substrate are configured so that the neutral plane of the BAW device is located within the piezoelectric layer.

In one embodiment of the BAW device, the bottom reflector section includes alternating bottom high acoustic impedance layers and bottom low acoustic impedance layers underneath the bottom electrode, while the top reflector section includes alternating top high acoustic impedance layers and top low acoustic impedance layers over the top electrode. Herein, the bottom high acoustic impedance layers have higher acoustic impedance, higher density, and higher stiffness than the bottom low acoustic impedance layers. The top high acoustic impedance layers have higher acoustic impedance, higher density, and higher stiffness than the top low acoustic impedance layers.

In one embodiment of the BAW device, the bottom substrate and the top substrate are formed of a same material, and the bottom substrate and the top substrate have a same thickness.

In one embodiment of the BAW device, the bottom substrate and the top substrate are formed of silicon.

In one embodiment of the BAW device, each of the bottom high acoustic impedance layers and each of the top high acoustic impedance layers are formed of a same material, and each of the bottom low acoustic impedance layers and each of the top low acoustic impedance layers are formed of a same material. A number of bottom high acoustic impedance layers and a number of the top high acoustic impedance layers are different, and a number of the bottom low acoustic impedance layers and a number of the top low acoustic impedance layers are different. The bottom reflector section and the top reflector section have a same thickness.

In one embodiment of the BAW device, each of the bottom high acoustic impedance layers and each of the top high acoustic impedance layers are formed of tungsten, and each of the bottom low acoustic impedance layers and each of the top low acoustic impedance layers are formed of silicon dioxide.

In one embodiment of the BAW device, the bottom high acoustic impedance layers and the top high acoustic impedance layers are formed of different materials, and the bottom low acoustic impedance layers and the top low acoustic impedance layers are formed of different materials. The number of the bottom high acoustic impedance layers and the number of the top high acoustic impedance layers are the same, and the number of the bottom low acoustic impedance layers and the number of the top low acoustic impedance layers are the same.

In one embodiment of the BAW device, each of the bottom high acoustic impedance layers and a corresponding top high acoustic impedance layer have different thicknesses, and each of the bottom low acoustic impedance layers and a corresponding top low acoustic impedance layer have different thicknesses. The bottom reflector section and the top reflector section have a same thickness.

In one embodiment of the BAW device, the bottom high acoustic impedance layers and the top high acoustic impedance layers are formed of different materials, and the bottom low acoustic impedance layers and the top low acoustic impedance layers are formed of different materials. The number of the bottom high acoustic impedance layers and the number of the top high acoustic impedance layers are different, and the number of the bottom low acoustic impedance layers and the number of the top low acoustic impedance layers are different. The bottom reflector section and the top reflector section have a same thickness.

In one embodiment of the BAW device, the number of the bottom high acoustic impedance layers and the number of the top high acoustic impedance layers are the same, and the number of the bottom low acoustic impedance layers and the number of the top low acoustic impedance layers are the same. Each of the bottom high acoustic impedance layers and a corresponding top high acoustic impedance layer have a same thickness, and each of the bottom low acoustic impedance layers and a corresponding top low acoustic impedance layer have a same thickness. Each of the bottom high acoustic impedance layers and each of the top high acoustic impedance layers are formed of a same material, and each of the bottom low acoustic impedance layers and each of the top low acoustic impedance layers are formed of a same material. The bottom substrate and the top substrate are formed of different materials, and the bottom substrate and the top substrate have different thicknesses.

In one embodiment of the BAW device, each of the bottom high acoustic impedance layers and each of the top high acoustic impedance layers are formed of tungsten. Each of the bottom low acoustic impedance layers and each of the top low acoustic impedance layers are formed of silicon dioxide.

In one embodiment of the BAW device, the bottom substrate is formed of silicon, and the top substrate is formed of silicon.

In one embodiment of the BAW device, the bottom reflector section is identical to the top reflector section, and the bottom substrate is identical to the top substrate.

In one embodiment of the BAW device, the bottom reflector section has a thickness between 0.1 μm and 10 μm, the top reflector section has a thickness between 0.1 μm and 10 μm, the bottom substrate has a thickness between 10 μm and 300 μm, and the top substrate has a thickness between 10 μm and 300 μm.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

It will be understood that for clear illustrations, FIGS. 1-4 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

Figure 1:
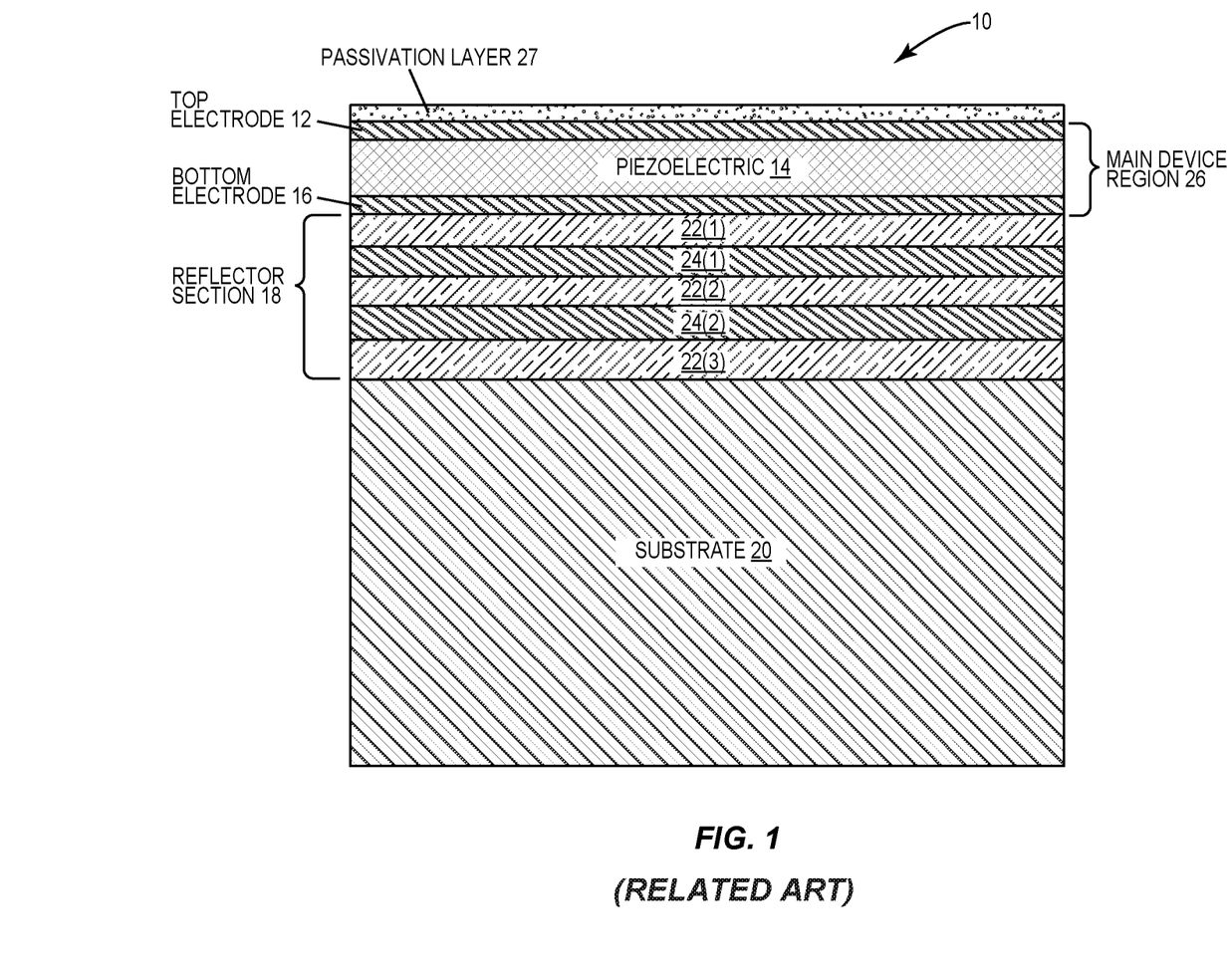
FIG. 1 shows a layer stack of a typical Bulk Acoustic Wave (BAW) device.

Due to their high Q values, and low insertion losses at microwave frequencies, Bulk Acoustic Wave (BAW) devices have been widely used in Radio Frequency (RF) applications. FIG. 1 shows a layer stack of a typical BAW device 10. In detail, the BAW device 10 includes a top electrode 12, a piezoelectric layer 14, a bottom electrode 16, a reflector section 18 with multiple alternating reflection layers with different acoustic impedance, and a substrate 20. The piezoelectric layer 14 is sandwiched between the top electrode 12 and the bottom electrode 16. The reflector section 18 resides underneath the bottom electrode 16 and resides over the substrate 20. By applying electrical signals to the top electrode 12 and the bottom electrode 16, acoustic waves are excited in the piezoelectric layer 14. The reflector section 18 is configured to minimize leakages of the acoustic waves from the piezoelectric layer 14. An active region for the BAW device 10 is formed where the top electrode 12 and the bottom electrode 16 overlap, and also includes the layers between and below the overlapping top and bottom electrodes 12 and 16.

The top electrode 12 and the bottom electrode 16 may be formed of tungsten (W), molybdenum (Mo), or platinum (Pt). The piezoelectric layer 14 may be formed of aluminum nitride (AlN) or zinc oxide (ZnO). The substrate 20 may be formed of silicon (Si). In one embodiment, the multiple alternating reflection layers within the reflector section 18 may include low acoustic impedance layers 22 and high acoustic impedance layers 24, which have higher acoustic impedance, higher density, and higher stiffness than the low acoustic impedance layers 22. The low acoustic impedance layers 22 may be formed of silicon dioxide ($SiO_2$), and the high acoustic impedance layers 24 may be formed of W. The bigger the differences in density and stiffness between adjacent low and high acoustic impedance layers 22 and 24, the better the reflection behavior of the reflector section 18.

For the purpose of this illustration, the reflector section 18 includes a first low acoustic impedance layer 22(1) underneath the bottom electrode 16, a first high acoustic impedance layer 24(1) underneath the first low acoustic impedance layer 22(1), a second low acoustic impedance layer 22(2) underneath the first high acoustic impedance layer 24(1), a second high acoustic impedance layer 24(2) underneath the second low acoustic impedance layer 22(2), and a third low acoustic impedance layer 22(3) underneath the second high acoustic impedance layer 24(2). The substrate 20 is underneath the third low acoustic impedance layer 22(3). In different applications, the reflector section 18 may include fewer or more alternating low and high acoustic impedance layers.

In general, the BAW device 10 has a fixed resonance frequency, at which resonance of acoustic waves in the piezoelectric layer 14 occurs. The resonance frequency of the BAW device 10 is defined by stiffness, thicknesses, locations, and material parameters of the piezoelectric layer 14, the top and bottom electrodes 12 and 16, and the low and high acoustic impedance layers 22 and 24 within the reflector section 18.

The top electrode 12, the piezoelectric layer 14, and the bottom electrode 16 typically show the largest frequency sensitivity for changes in stiffness, and thus have the biggest impact on the resonance frequency of the BAW device 10 (e.g., a stiffer layer resulting in a faster resonance frequency). The frequency sensitivity of a layer depends strongly on its position relative to the piezoelectric layer 14, and decreases exponentially away from the piezoelectric layer 14. Therefore, the low acoustic impedance layers 22 and the high acoustic impedance layers 24 within the reflector section 18 have much less impact on the resonance frequency of the BAW device 10 than the piezoelectric layer 14, the top electrode 12, and the bottom electrode 16. In addition, the first low acoustic impedance layer 22(1) has a bigger impact on the resonance frequency of the BAW device 10 than the rest of the low acoustic impedance layers 22(2) and 22(3). The first high acoustic impedance layer 24(1) has a bigger impact on the resonance frequency of the BAW device 10 than the second high acoustic impedance layer 24(2). As described above, even a same stiffness change is applied to the piezoelectric layer 14 and a layer within the reflector section 18, there is still a big difference in frequency influence on the BAW device 10. Herein, the top electrode 12, the piezoelectric layer 14, and the bottom electrode 16 form a main device region 26.

In some applications, the BAW device 10 may also include a passivation layer 27 over the top electrode 12 (at least covering the active region) to protect the BAW device 10 from an external environment. The passivation layer 27 may be formed of Silicon Nitride (SiN), $SiO_2$, or Silicon Oxynitride (SiON).

Figure 2:
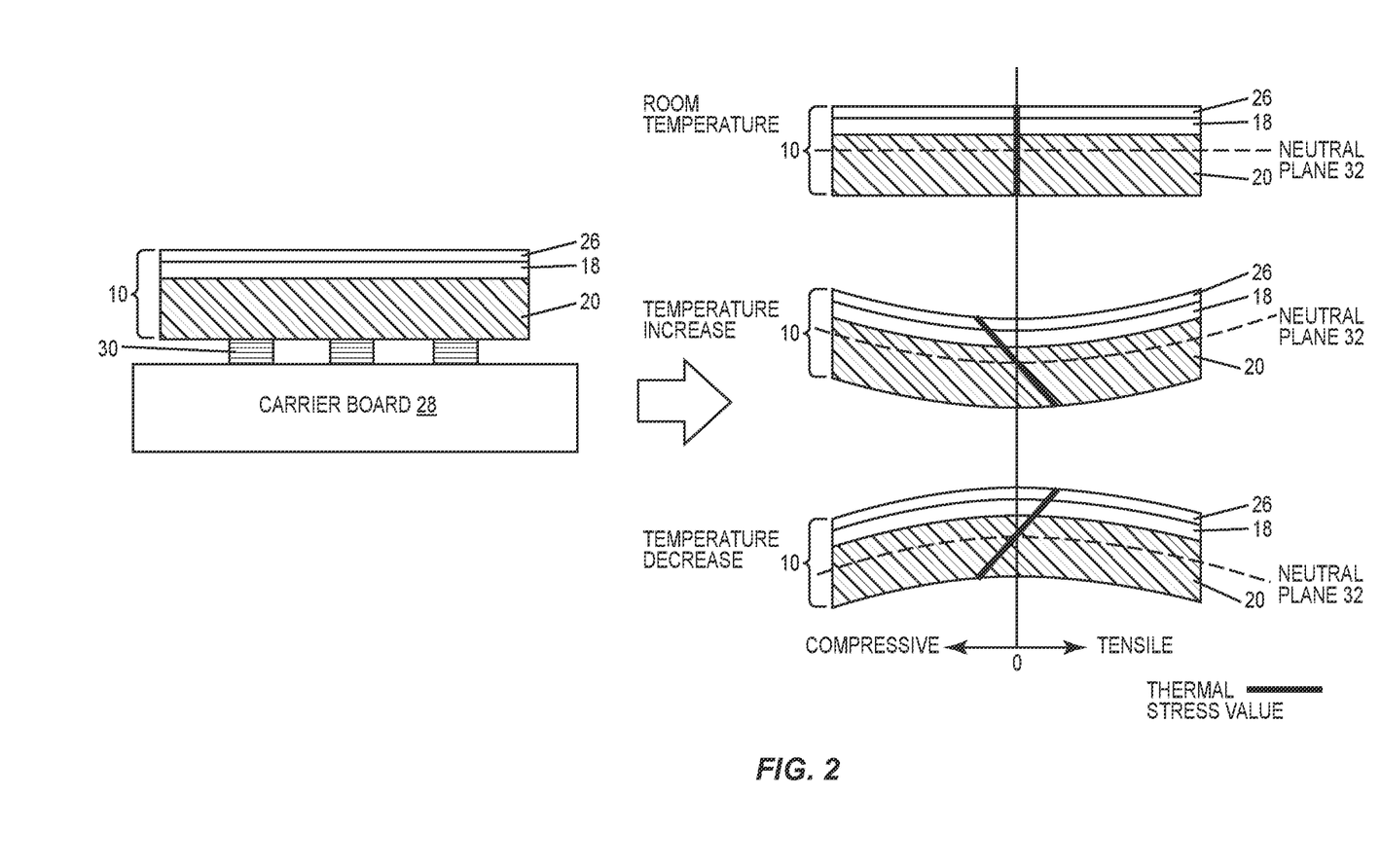
FIG. 2 shows a diagram of thermal stress effects of the typical BAW device as shown in FIG. 1.

FIG. 2 shows a diagram of thermal stress effects of the BAW device 10 due to changes in temperature, when the BAW device 10 is packaged with a carrier board 28 (e.g., printed circuit board). Herein, the BAW device 10 is simplified as a combination of the main device region 26, the reflector section 18, and the substrate 20 that is connected to the carrier board 28 via a number of connection components 30 (e.g., solder pumps, or metal pillars). The main device region 26 is a furthest portion of the BAW device 10 from the carrier board 28. In general, the substrate 20 of the BAW device 10 and the carrier board 28 are formed of different materials with different coefficient of thermal expansions (CTEs). In a non-limited example, the substrate 20 of the BAW device 10 is formed of silicon, while the carrier board 28 may be a printed circuit board (PCB), which may be formed of laminate (organic or inorganic in composition, like plastic). As such, extra thermal stress (besides thermal stress arising within the BAW device 10 due to a temperature change when the substrate 20, the reflector section 18, and the main device region 26 have different CTEs) will arise within the BAW device 10 due to the temperature change when the substrate 20 and the carrier board 28 have different CTEs. In consequence, the BAW device 10 will have extra stiffness changes.

Since the substrate 20 is significantly thicker than the reflector section 18 and the main device region 26, a neutral plane 32 of the BAW device 10 is typically located within the substrate 20, (shown as a dashed line). In some applications, the neutral plane 32 of the BAW device 10 may be located within the reflector section 18 (close to the substrate 20, not shown), but not located in the main device region 26. Herein, the neutral plane 32 of the BAW device 10 refers to a plane inside the BAW device 10, which is not subject to thermal stress, either compression or tension, when the BAW device 10 is bending due to temperature changes. Other portions of the BAW device 10 other than the neutral plane 32 will be affected by the thermal stress due to the temperature changes. Since the main device region 26 is an edge (top) portion of the BAW device 10 (away from the neutral plane 32), the main device region 26 will suffer the extra thermal stress as well as the extra stiffness change significantly when the temperature changes. In addition, within the BAW device 10, the main device region 26 shows the largest frequency sensitivity for changes in stiffness, therefore, the extra stiffness change of the main device region 26 will result in a significant additional (undesired) frequency shift of the BAW device 10.

In a non-limited example, the substrate 20 of the BAW device 10 is formed of silicon and the carrier board 28 is formed of plastic, such that the substrate 20 of the BAW device 10 has a smaller CTE than the carrier board 28. When the temperature is unchanged (e.g., at room temperature), the BAW device 10 is flat in horizontal directions (see the upper row of the diagram in FIG. 2).

When the temperature increases, the BAW device 10 bends upward in a vertical direction (like a dish) at least due to the different CTEs between the substrate 20 and the carrier board 28 (maybe also due to the different CTEs among the substrate 20, the reflector section 18, and the main device region 26). An upper portion (above the neutral plane 32) of the BAW device 10 is under compression and a bottom portion (below the neutral plane 32) experiences tension (see the middle row of the diagram in FIG. 2). For the purpose of this illustration, when the temperature increases, the main device region 26, the reflector section 18, and a portion of the substrate 20 are under compression, the neutral plane 32 is not under any compression or tension, and the remaining portion of the substrate 20 is under tension. Specifically, within the BAW device 10, the main device region 26 suffers the largest compression and has a largest stiffness increase. As such, a frequency shift of the BAW device 10 (e.g., the resonance frequency of the BAW device 10 is increasing), which is from the compression/stiffness change at least due to the different CTEs between the substrate 20 and the carrier board 28, is very significant.

Similarly, when the temperature decreases, the BAW device 10 bends downward in a vertical direction (like a lid) at least due to the different CTEs between the substrate 20 and the carrier board 28 (maybe also due to the different CTEs among the substrate 20, the reflector section 18, and the main device region 26). The upper portion (above the neutral plane 32) of the BAW device 10 is under tension and the bottom portion (below the neutral plane 32) is under compression (see the lower row of the diagram in FIG. 2). For the purpose of this illustration, when the temperature decreases, the main device region 26, the reflector section 18 and a portion of the substrate 20 are under tension, the neutral plane 32 is still not under any compression or tension, and the remaining portion of the substrate 20 is under compression. Specifically, within the BAW device 10, the main device region 26 suffers the largest tension and has a largest stiffness decrease. As such, a frequency shift of the BAW device 10 (e.g., the resonance frequency of the BAW device 10 is decreasing), which is from the tension/stiffness change at least due to the different CTEs between substrate 20 and the carrier board 28, is very significant as well. Notice that, the (positive/negative) frequency shift of the BAW device 10 will make the resonance frequency of the BAW device drift under temperature and affect the overall performance of the BAW device 10. Therefore, an extra frequency shift caused from the CTE difference between the substrate 20 and the carrier board 28 (packaging the BAW device 10 with the carrier board 28) is undesired.

Figure 3:
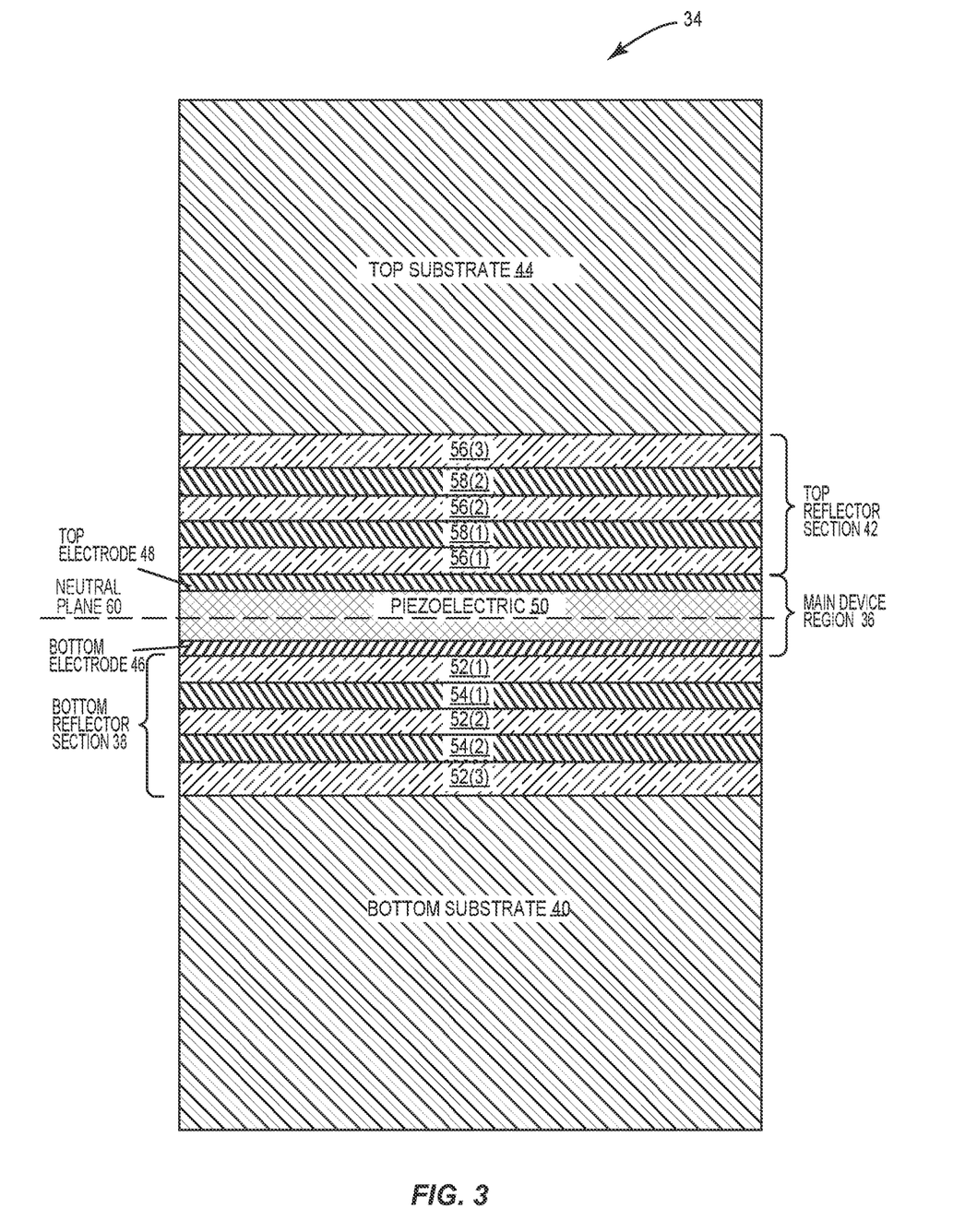
FIG. 3 shows an exemplary layer stack of a temperature compensated BAW device with a substantially symmetrical structure in a vertical direction, according to one embodiment of the present disclosure.

FIG. 3 shows an exemplary layer stack of a temperature compensated BAW device 34 with a substantially symmetrical structure in a vertical direction, according to one embodiment of the present disclosure. In detail, the temperature compensated BAW device 34 includes a main device region 36, a bottom reflector section 38, a bottom substrate 40, a top reflector section 42, and a top substrate 44. Herein, the main device region 36 includes a bottom electrode 46, a top electrode 48, and a piezoelectric layer 50 vertically sandwiched between the bottom electrode 46 and the top electrode 48. The bottom electrode 46 and the top electrode 48 may be formed of W, Mo, or Pt, and the piezoelectric layer 50 may be formed of AlN or ZnO.

The bottom reflector section 38 resides underneath the bottom electrode 46 of the main device region 36. By applying electrical signals to the bottom electrode 46 and the top electrode 48, acoustic waves are excited in the piezoelectric layer 50. The bottom reflector section 38 is configured to reduce leakages of the acoustic waves from the piezoelectric layer 50. The bottom reflector section 38 has multiple alternating reflection layers with different acoustic impedance. In one embodiment, the multiple alternating reflection layers within the bottom reflector section 38 may include bottom low acoustic impedance layers 52 and bottom high acoustic impedance layers 54, which have higher acoustic impedance, higher density, and higher stiffness than the bottom low acoustic impedance layers 52. The bottom low acoustic impedance layers 52 may be formed of $SiO_2$, and the bottom high acoustic impedance layers 54 may be formed of W. The bigger the differences in density and stiffness between adjacent bottom low and high acoustic impedance layers 52 and 54, the better the reflection behavior of the bottom reflector section 38.

For the purpose of this illustration, the bottom reflector section 38 includes a first bottom low acoustic impedance layer 52(1) underneath the bottom electrode 16, a first bottom high acoustic impedance layer 54(1) underneath the first bottom low acoustic impedance layer 52(1), a second bottom low acoustic impedance layer 52(2) underneath the first bottom high acoustic impedance layer 54(1), a second bottom high acoustic impedance layer 54(2) underneath the second bottom low acoustic impedance layer 52(2), and a third bottom low acoustic impedance layer 52(3) underneath the second bottom high acoustic impedance layer 54(2). In different applications, the bottom reflector section 38 may include fewer or more alternating bottom low and bottom high acoustic impedance layers.

The bottom substrate 40 resides underneath the bottom reflector section 38. For the purpose of this illustration, the bottom substrate 40 resides underneath the third bottom low acoustic impedance layer 52(3). The bottom substrate 40 may be formed of Si.

Unlike the BAW device 10 only having the reflector section 18 and the substrate 20 underneath the main device region 26, the temperature compensated BAW device 34, besides having the bottom reflector section 38 and the bottom substrate 40 underneath the main device region 36, further includes the top reflector section 42 and the top substrate 44 over the main device region 36.

The top reflector section 42 resides over the top electrode 48 of the main device region 36. The top reflector section 42, similar to the bottom reflector section 38, is also configured to reduce leakages of the acoustic waves from the piezoelectric layer 50, The top reflector section 42 has multiple alternating reflection layers with different acoustic impedance. In one embodiment, the multiple alternating reflection layers within the top reflector section 42 may include top low acoustic impedance layers 56 and top high acoustic impedance layers 58, which have higher acoustic impedance, higher density, and higher stiffness than the top low acoustic impedance layers 56. The top low acoustic impedance layers 56 may be formed of $SiO_2$, and the top high acoustic impedance layers 58 may be formed of W. The bigger the differences in density and stiffness between adjacent top low and high acoustic impedance layers 56 and 58, the better the reflection behavior of the top reflector section 42.

For the purpose of this illustration, the top reflector section 42 includes a first top low acoustic impedance layer 56(1) over the top electrode 48, a first top high acoustic impedance layer 58(1) over the first top low acoustic impedance layer 56(1), a second top low acoustic impedance layer 56(2) over the first top high acoustic impedance layer 58(1), a second top high acoustic impedance layer 58(2) over the second top low acoustic impedance layer 56(2), and a third top low acoustic impedance layer 56(3) over the second top high acoustic impedance layer 58(2). In different applications, the top reflector section 42 may include fewer or more alternating top low and top high acoustic impedance layers.

The top substrate 44 resides over the top reflector section 42. For the purpose of this illustration, the top substrate 44 resides over the third top low acoustic impedance layer 56(3). The top substrate 40 may be formed of Si. The bottom reflector section 38 may have a thickness between 0.1 µm and 10 µm, the bottom substrate 40 may have a thickness between 10 µm and 300 µm, the top reflector section 42 may have a thickness between 0.1 µm and 10 µm, and the top substrate 44 may have a thickness between 10 µm and 300 µm.

Typically, the temperature compensated BAW device 34 may have a fixed resonance frequency, at which resonance of acoustic waves in the piezoelectric layer 50 occurs. The resonance frequency of the temperature compensated BAW device 34 is defined by stiffness, thicknesses, locations, and material parameters of the piezoelectric layer 50, the bottom and top electrodes 46 and 48, the bottom low and high acoustic impedance layers 52 and 54 within the bottom reflector section 38, and the top low and high acoustic impedance layers 56 and 58 within the top reflector section 42.

The top electrode 48, the piezoelectric layer 50, and the bottom electrode 46 show the largest frequency sensitivity for changes in stiffness, and thus have the biggest impact on the resonance frequency of the temperature compensated BAW device 34 (e.g., a stiffer layer resulting in a faster resonance frequency). The frequency sensitivity of a layer depends strongly on its position relative to the piezoelectric layer 50, and decreases exponentially away from the piezoelectric layer 50. The low/bottom high acoustic impedance layers 52 and 54 within the bottom reflector section 38 and the low/top high acoustic impedance layers 56 and 58 within the top reflector section 42 have much less impact on the resonance frequency of the temperature compensated BAW device 34 than the piezoelectric layer 50, the top electrode 48, and the bottom electrode 46.

Notice that, with the main device region 36 as a center, the temperature compensated BAW device 34 has a substantially symmetrical structure in a vertical direction. The bottom reflector section 38, the bottom substrate 40, the top reflector section 42, and the top substrate 44 are configured so that a neutral plane 60 (shown as a dashed line in FIG. 4) of the temperature compensated BAW device 34 is located within the main device region 36. In one embodiment, the bottom reflector section 38 is identical to the top reflector section 42, and the bottom substrate 40 is identical to the top substrate 44. Herein, the bottom reflector section 38 and the top reflector section 42 have a same number of low acoustic impedance layers and high acoustic impedance layers. Each bottom low acoustic impedance layer 52 in the bottom reflector section 38 and a corresponding top low acoustic impedance layer 56 in the top reflector section 42 have a same thickness and may be formed of $SiO_2$. Each bottom high acoustic impedance layer 54 in the bottom reflector section 38 and a corresponding top high acoustic impedance layer 58 in the top reflector section 42 have a same thickness and may be formed of W. The bottom substrate 40 and the top substrate 44 have a same thickness and may be formed of Si. The neutral plane 60 of the temperature compensated BAW device 34 is located within the piezoelectric layer 50.

In one embodiment, the bottom substrate 40 is identical to the top substrate 44 (with a same thickness and formed of a same material, like Si), while the bottom reflector section 38 and the top reflector section 42 may have different thicknesses, include different numbers of layers, and/or be formed of different materials. In a non-limited example, each of the bottom low acoustic impedance layers 52 and each of the top low acoustic impedance layers 56 are formed of a same material, like $SiO_2$, and each of the bottom high acoustic impedance layers 54 and each of the top high acoustic impedance layers 58 are formed of a same material, like W. A number of the bottom low acoustic impedance layers 52 and a number of the top low acoustic impedance layers 56 are different, and a number of the bottom high acoustic impedance layers 54 and a number of the top high acoustic impedance layers 58 are different. The bottom reflector section 38 and the top reflector section 42 may have a same or different thickness(es). In a non-limited example, the bottom low acoustic impedance layers 52 and the top low acoustic impedance layers 56 may be formed of different materials (e.g., $SiO_2$, aluminum, or beryllium), and the bottom high acoustic impedance layers 54 and the top high acoustic impedance layers 58 are formed of different materials (e.g., W, aluminum nitride, molybdenum, silicon nitride, ruthenium, or iridium). The number of the bottom low acoustic impedance layers 52 and the number of the top low acoustic impedance layers 56 are the same, and the number of the bottom high acoustic impedance layers 54 and the number of the top high acoustic impedance layers 58 are the same. Each of the bottom low acoustic impedance layers 52 and a corresponding top low acoustic impedance layer 56 may have a same or different thickness(es). Each of the bottom high acoustic impedance layers 54 and a corresponding top high acoustic impedance layer 58 may have a same or different thickness(es). The bottom reflector section 38 and the top reflector section 42 may have a same or different thickness(es). In a non-limited example, the bottom low acoustic impedance layers 52 and the top low acoustic impedance layers 56 are formed of different materials, and the bottom high acoustic impedance layers 54 and the top high acoustic impedance layers 58 are formed of different materials. The number of the bottom low acoustic impedance layers 52 and the number of the top low acoustic impedance layers 56 are different, and the number of the bottom high acoustic impedance layers 54 and the number of the top high acoustic impedance layers 58 are different. The bottom reflector section 38 and the top reflector section 42 may have a same or different thickness(es). In any circumstances, the bottom reflector section 38 is still substantially symmetrical to the top reflector section 42, such that the neutral plane 60 is within the piezoelectric layer 50 or at least within the main device region 36.

In one embodiment, the bottom reflector section 38 and the top reflector section 42 are identical, while the bottom substrate 40 and the top substrate 44 may have different thicknesses and/or be formed of different materials. In a non-limited example, both the bottom substrate 40 and the top substrate 44 may be formed of Si, and substantially symmetrical to each other. As such, the neutral plane 60 is within the piezoelectric layer 50 or at least within the main device region 36. In a non-limited example, the top substrate 44 may be thicker than the bottom substrate 40, but the neutral plane 60 is still within the piezoelectric layer 50 or at least within the main device region 36.

In one embodiment, the bottom reflector section 38 and the top reflector section 42 may have different thicknesses, include different numbers of layers, and/or be formed of different materials, while the bottom substrate 40 and the top substrate 44 may have different thicknesses and/or be formed of different materials. However, a combination of the bottom reflector section 38 and the bottom substrate 40 is still substantially symmetrical to a combination of the top reflector section 42 and the top substrate 44, such that the neutral plane 60 is within the piezoelectric layer 50 or at least within the main device region 36.

Figure 4:
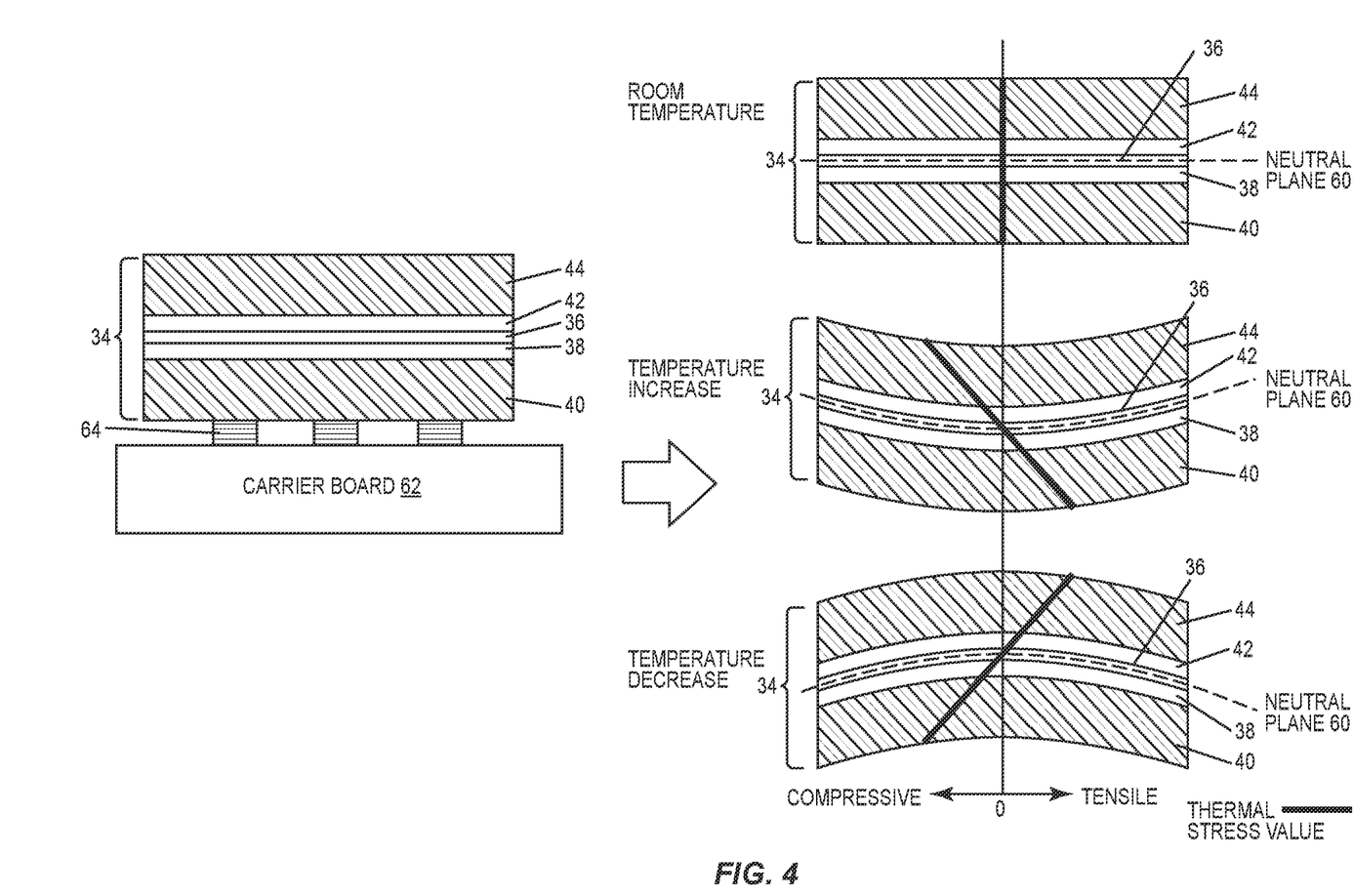
FIG. 4 shows a diagram of thermal stress effects on the temperature compensated BAW device as shown in FIG. 3.

FIG. 4 shows a diagram of thermal stress effects of the temperature compensated BAW device 34 due to changes in temperature, when the temperature compensated BAW device 34 is packaged with a carrier board 62 (e.g., printed circuit board). Herein, the temperature compensated BAW device 34 is simplified as a combination of the main device region 36, the top reflector section 42, the top substrate 44, the bottom reflector section 38, and the bottom substrate 40 that is connected to the carrier board 62 via a number of connection components 64 (e.g., solder pumps, or metal pillars). The main device region 36 is located in the central portion (in vertical direction) of the temperature compensated BAW device 34.

Typically, the bottom/top substrate 40/44, the bottom/top reflector section 38/42, and the main device region 36 include different materials with different CTEs. As such, thermal stress (stiffness change) will arise within the temperature compensated BAW device 34 due to the temperature change. In addition, the bottom substrate 40 of the temperature compensated BAW device 34 and the carrier board 62 may be formed of different materials with different CTEs, such that extra thermal stress will arise within the temperature compensated BAW device 34 when the temperature changes. In consequence, the temperature compensated BAW device 34 will have extra stiffness changes.

In a non-limited example, the bottom substrate 40 is formed of silicon while the carrier board 62 may be a printed circuit board (PCB), which may be formed of laminate (organic or inorganic in composition, like plastic). As such, that the bottom substrate 40 has a smaller CTE than the carrier board 62. When the temperature is unchanged (e.g., at room temperature), the temperature compensated BAW device 34 is flat in horizontal directions (see the upper row of the diagram in FIG. 4).

As described above, temperature compensated BAW device 34 is configured to have a substantially symmetrical structure in a vertical direction, such that the neutral plane 60 of the temperature compensated BAW device 34 is located within the main device region 36. It is well known that the further away from the neutral plane 60, the greater the thermal stress. Therefore, within the temperature compensated BAW device 34, the main device region 36 bears the minimum (close to zero) thermal stress. When the temperature increases (see the middle row of the diagram in FIG. 4), the temperature compensated BAW device 34 bends upward in a vertical direction (like a dish). Herein, the bottom substrate 40 bears the maximum tensile stress, the top substrate 44 bears the maximum compressive stress, the bottom reflector section 38 bears smaller tensile stress (compared to the tensile stress in the bottom substrate 40), the top reflector section 42 bears smaller compressive stress (compared to the compressive stress in the top substrate 44), and the main device region 36 bears the minimum (close to zero) tensile and compressive stress. In consequence, the bottom substrate 40 and the top substrate 44 will obtain the largest stiffness change, the bottom reflector section 38 and the top reflector section 42 will obtain a smaller stiffness change (compared to the stiffness change in the bottom/top substrates 40/44), and the main device region 36 will obtain a smallest stiffness change.

When the temperature decreases (see the lower row of the diagram in FIG. 4), the temperature compensated device 34 bends downward in a vertical direction (like a lid). Herein, the bottom substrate 40 bears the maximum compressive stress, the top substrate 44 bears the maximum tensile stress, the bottom reflector section 38 bears smaller compressive stress (compared to the compressive stress in the bottom substrate 40), the top reflector section 42 bears smaller tensile stress (compared to the tensile stress in the top substrate 44), and the main device region 36 bears the minimum (close to zero) tensile and compressive stress. In consequence, the bottom substrate 40 and the top substrate 44 will obtain the largest stiffness change, the bottom reflector section 38 and the top reflector section 42 will obtain a smaller stiffness change (compared to the stiffness change in the bottom/top substrates 40/44), and the main device region 36 will obtain a smallest stiffness change.

Within the temperature compensated BAW device 34, since the bottom and top substrates 40 and 44 have negligible frequency sensitivity for changes in stiffness, there will be no significant frequency shift (from the original resonance frequency) due to the largest stiffness change in the bottom and top substrates 40 and 44. In addition, the bottom and top reflector sections 38 and 42 have very small frequency sensitivity (compared to the main device region 36) for changes in stiffness, therefore, there will also be no significant frequency shift (from the original resonance frequency) due to the stiffness change in the bottom and top reflector sections 38 and 42. Furthermore, the main device region 36 shows the largest frequency sensitivity for changes in stiffness. However, the stiffness change within the main device region 36 is very weak (the neutral plane 60 is within main device region 36, in some cases within the piezoelectric layer 50), therefore, no significant frequency shift (from the original resonance frequency) will occur due to the negligible stiffness change in the device region 36. In summary, when temperature changes, even if the CTEs between the bottom substrate 40 and the carrier board 62 do not match, there will be no significant extra frequency shift introduced to the resonance frequency of the temperature compensated BAW device 34.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A Bulk Acoustic Wave (BAW) device comprising:
a main device region comprising a top electrode, a bottom electrode, and a piezoelectric layer sandwiched between the top electrode and the bottom electrode;
a bottom reflector section underneath the bottom electrode;
a bottom substrate underneath the bottom reflector section;
a top reflector section over the top electrode; and
a top substrate over the bottom reflector section, wherein:
the bottom reflector section, the bottom substrate, the top reflector section, and the top substrate are configured so that a neutral plane of the BAW device is located within the main device region; and
at least one pair of the bottom reflector section and the top reflector section and a pair of the bottom substrate and the top substrate are not identical.

2. The BAW device of claim 1 wherein the bottom reflector section, the bottom substrate, the top reflector section, and the top substrate are configured so that the neutral plane of the BAW device is located within the piezoelectric layer.

3. The BAW device of claim 1 wherein:
the bottom reflector section includes alternating bottom high acoustic impedance layers and bottom low acoustic impedance layers underneath the bottom electrode, wherein the bottom high acoustic impedance layers have higher acoustic impedance, higher density, and higher stiffness than the bottom low acoustic impedance layers; and
the top reflector section includes alternating top high acoustic impedance layers and top low acoustic impedance layers over the top electrode, wherein the top high acoustic impedance layers have higher acoustic impedance, higher density, and higher stiffness than the top low acoustic impedance layers.

4. The BAW device of claim 3 wherein:
the bottom substrate and the top substrate are formed of a same material; and
the bottom substrate and the top substrate have a same thickness.

5. The BAW device of claim 4 wherein the bottom substrate and the top substrate are formed of silicon.

6. The BAW device of claim 4 wherein:
each of the bottom high acoustic impedance layers and each of the top high acoustic impedance layers are formed of a same material;
each of the bottom low acoustic impedance layers and each of the top low acoustic impedance layers are formed of a same material;
a number of the bottom high acoustic impedance layers and a number of the top high acoustic impedance layers are different; and
a number of the bottom low acoustic impedance layers and a number of the top low acoustic impedance layers are different.

7. The BAW device of claim 6 wherein:
each of the bottom high acoustic impedance layers and each of the top high acoustic impedance layers are formed of tungsten; and
each of the bottom low acoustic impedance layers and each of the top low acoustic impedance layers are formed of silicon dioxide.

8. The BAW device of claim 6 wherein the bottom reflector section and the top reflector section have a same thickness.

9. The BAW device of claim 4 wherein:
the bottom high acoustic impedance layers and the top high acoustic impedance layers are formed of different materials;
the bottom low acoustic impedance layers and the top low acoustic impedance layers are formed of different materials;
a number of the bottom high acoustic impedance layers and a number of the top high acoustic impedance layers are the same; and
a number of the bottom low acoustic impedance layers and a number of the top low acoustic impedance layers are the same.

10. The BAW device of claim 9 wherein:
each of the bottom high acoustic impedance layers and a corresponding top high acoustic impedance layer have different thicknesses; and
each of the bottom low acoustic impedance layers and a corresponding top low acoustic impedance layer have different thicknesses.

11. The BAW device of claim 10 wherein the bottom reflector section and the top reflector section have a same thickness.

12. The BAW device of claim 9 wherein:
each of the bottom high acoustic impedance layers and a corresponding top high acoustic impedance layer have a same thickness; and
each of the bottom low acoustic impedance layers and a corresponding top low acoustic impedance layer have a same thickness.

13. The BAW device of claim 4 wherein:
the bottom high acoustic impedance layers and the top high acoustic impedance layers are formed of different materials;
the bottom low acoustic impedance layers and the top low acoustic impedance layers are formed of different materials;
a number of the bottom high acoustic impedance layers and a number of the top high acoustic impedance layers are different; and
a number of the bottom low acoustic impedance layers and a number of the top low acoustic impedance layers are different.

14. The BAW device of claim 13 wherein the bottom reflector section and the top reflector section have a same thickness.

15. The BAW device of claim 3 wherein:
a number of the bottom high acoustic impedance layers and a number of the top high acoustic impedance layers are the same;

a number of the bottom low acoustic impedance layers and a number of the top low acoustic impedance layers are the same;
each of the bottom high acoustic impedance layers and a corresponding top high acoustic impedance layer have a same thickness;
each of the bottom low acoustic impedance layers and a corresponding top low acoustic impedance layer have a same thickness;
each of the bottom high acoustic impedance layers and each of the top high acoustic impedance layers are formed of a same material; and
each of the bottom low acoustic impedance layers and each of the top low acoustic impedance layers are formed of a same material.

16. The BAW device of claim 15 wherein:
each of the bottom high acoustic impedance layers and each of the top high acoustic impedance layers are formed of tungsten; and
each of the bottom low acoustic impedance layers and each of the top low acoustic impedance layers are formed of silicon dioxide.

17. The BAW device of claim 15 wherein:
the bottom substrate and the top substrate are formed of different materials; and/or
the bottom substrate and the top substrate have different thicknesses.

18. The BAW device of claim 17 wherein:
the bottom substrate is formed of silicon; and
the top substrate is formed of silicon.

19. The BAW device of claim 1 wherein:
the bottom reflector section and the top reflector section are not identical; and
the bottom substrate and the top substrate are not identical.

20. The BAW device of claim 1 wherein:
the bottom reflector section has a thickness between 0.1 μm and 10 μm;
the top reflector section has a thickness between 0.1 μm and 10 μm;
the bottom substrate has a thickness between 10 μm and 300 μm; and
the top substrate has a thickness between 10 μm and 300 μm.

\* \* \* \* \*

UNITED STATES PATENT AND TRADEMARK OFFICE
CERTIFICATE OF CORRECTION

| | | |
|---|---|---|
| PATENT NO. | : 12,052,010 B2 | |
| APPLICATION NO. | : 17/371836 | |
| DATED | : July 30, 2024 | |
| INVENTOR(S) | : Gernot Fattinger et al. | |

It is certified that error appears in the above-identified patent and that said Letters Patent is hereby corrected as shown below:

In the Claims

In Column 13, Line 32, replace "at least one pair of" with --at least one of a pair of--.

Signed and Sealed this
Nineteenth Day of November, 2024

Katherine Kelly Vidal
*Director of the United States Patent and Trademark Office*